(12) United States Patent
Hack et al.

(10) Patent No.: US 10,756,141 B2
(45) Date of Patent: Aug. 25, 2020

(54) VERY HIGH RESOLUTION STACKED OLED DISPLAY

(71) Applicant: Universal Display Corporation, Ewing, NJ (US)

(72) Inventors: Michael Hack, Princeton, NJ (US); Michael Stuart Weaver, Princeton, NJ (US); William E. Quinn, Whitehouse Station, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/658,752

(22) Filed: Jul. 25, 2017

(65) Prior Publication Data

US 2018/0033839 A1    Feb. 1, 2018

Related U.S. Application Data (60) Provisional application No. 62/367,934, filed on Jul. 28, 2016.

(51) Int. Cl.
| | | |
|---|---|---|
| *H01L 27/32* | (2006.01) | |
| *H01L 51/52* | (2006.01) | |
| *H01L 51/56* | (2006.01) | |

(52) U.S. Cl.
CPC ...... *H01L 27/3213* (2013.01); *H01L 51/5203* (2013.01); *H01L 51/5209* (2013.01); *H01L 51/5225* (2013.01); *H01L 51/5265* (2013.01); *H01L 51/56* (2013.01)

(58) Field of Classification Search
None
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |

(Continued)

FOREIGN PATENT DOCUMENTS

| | | |
|---|---|---|
| CN | 101822125 A | 9/2010 |
| CN | 103779383 A | 5/2014 |

(Continued)

OTHER PUBLICATIONS

Baldo, "Highly efficient phosphorescent emission from organic electroluminescent devices," Nature, vol. 395, pp. 151-154, 1998.

(Continued)

*Primary Examiner* — Michelle Mandala
*Assistant Examiner* — Jordan M Klein
(74) *Attorney, Agent, or Firm* — Morris & Kamlay LLP (57) ABSTRACT

A full-color display and techniques for fabrication thereof are provided. The display includes first and second continuous independently addressable organic emissive layers disposed over a single substrate or between two substrates or portions of a flexible substrate. The use of continuous emissive layers of a limited number of colors allows for a relatively high resolution display to be achieved without the use of fine metal masks or similar components.

21 Claims, 7 Drawing Sheets

(56) References Cited

U.S. PATENT DOCUMENTS

| | | |
|---|---|---|
| 5,757,139 A | 5/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,280,559 B1 | 8/2001 | Terada et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,984,934 B2 | 1/2006 | Möller et al. |
| 7,038,373 B2 | 5/2006 | Arnold et al. |
| 7,279,704 B2 | 10/2007 | Walters et al. |
| 7,431,968 B1 | 10/2008 | Shtein et al. |
| 7,714,500 B2 | 5/2010 | Hirakata et al. |
| 7,968,146 B2 | 6/2011 | Wagner et al. |
| 8,125,138 B2 | 2/2012 | Luttgens et al. |
| 8,159,426 B2 | 4/2012 | Chang et al. |
| 8,400,018 B2 | 3/2013 | Joannopoulos et al. |
| 8,502,445 B2 | 8/2013 | Levermore et al. |
| 8,827,488 B2 | 9/2014 | Weaver et al. |
| 8,896,200 B2 | 11/2014 | Huang et al. |
| 9,171,890 B2 | 10/2015 | Naijo |
| 9,231,227 B2 | 1/2016 | Weaver et al. |
| 2003/0178936 A1 | 9/2003 | Park et al. |
| 2003/0230980 A1 | 12/2003 | Forrest et al. |
| 2004/0061107 A1 | 4/2004 | Duggal |
| 2004/0174116 A1 | 9/2004 | Lu et al. |
| 2005/0236981 A1* | 10/2005 | Cok ............... H01L 27/3209 313/504 |
| 2005/0249972 A1* | 11/2005 | Hatwar ............ H01L 51/5265 428/690 |
| 2005/0280008 A1* | 12/2005 | Ricks ............... C09K 11/06 257/79 |
| 2006/0033426 A1 | 2/2006 | Chao et al. |
| 2006/0214596 A1* | 9/2006 | Miller ............... G09G 3/3233 315/169.3 |
| 2007/0146242 A1* | 6/2007 | Miller ............... G09G 3/2074 345/76 |
| 2007/0205423 A1 | 9/2007 | Yamazaki et al. |
| 2007/0279372 A1 | 12/2007 | Brown Elliott et al. |
| 2008/0198180 A1 | 8/2008 | Langendijk |
| 2009/0092325 A1 | 4/2009 | Brown Elliott et al. |
| 2009/0295283 A1 | 12/2009 | Kim et al. |
| 2010/0090620 A1 | 4/2010 | Hack et al. |
| 2010/0103187 A1 | 4/2010 | Linssen |
| 2010/0187988 A1 | 7/2010 | Forrest et al. |
| 2010/0219427 A1 | 9/2010 | Fukuda |
| 2010/0231484 A1 | 9/2010 | Cok et al. |
| 2010/0244069 A1 | 9/2010 | Weaver |
| 2011/0062427 A1 | 3/2011 | Jeong et al. |
| 2011/0085068 A1 | 4/2011 | Ito et al. |
| 2011/0095276 A1 | 4/2011 | Imai et al. |
| 2011/0096530 A1 | 4/2011 | Shimizu et al. |
| 2011/0186819 A1 | 8/2011 | Kume |
| 2011/0233600 A1 | 9/2011 | Lin et al. |
| 2011/0248294 A1 | 10/2011 | Weaver et al. |
| 2011/0309389 A1 | 12/2011 | Yu et al. |
| 2012/0075278 A1 | 3/2012 | Hara et al. |
| 2012/0205685 A1* | 8/2012 | Seo ............... H01L 51/5044 257/89 |
| 2012/0242217 A1* | 9/2012 | Matsumoto ...... H01L 27/3213 313/504 |
| 2012/0287605 A1 | 11/2012 | Chen et al. |
| 2013/0082589 A1 | 4/2013 | So et al. |
| 2013/0105833 A1 | 5/2013 | Weaver et al. |
| 2013/0187132 A1 | 7/2013 | Ando et al. |
| 2013/0285537 A1 | 10/2013 | Chaji |
| 2014/0065750 A1 | 3/2014 | Harikrishna Mohan et al. |
| 2014/0084256 A1 | 3/2014 | Kim et al. |
| 2014/0110726 A1 | 4/2014 | Naijo |
| 2014/0183471 A1 | 7/2014 | Heo |
| 2014/0203244 A1 | 7/2014 | Hack et al. |
| 2014/0209888 A1 | 7/2014 | Hack et al. |
| 2014/0327709 A1 | 11/2014 | Hack et al. |
| 2015/0171374 A1 | 6/2015 | Burrows et al. |
| 2015/0340410 A1 | 11/2015 | Hack et al. |
| 2015/0349034 A1 | 12/2015 | Hack et al. |
| 2016/0072069 A1 | 3/2016 | Takeuchi |

FOREIGN PATENT DOCUMENTS

| | | |
|---|---|---|
| CN | 105165122 A | 12/2015 |
| JP | 2005174639 A | 6/2005 |
| JP | 2010010041 A | 1/2010 |
| WO | WO-2008057394 A1 | 5/2008 |
| WO | 2010002030 A1 | 1/2010 |
| WO | WO-2010011390 A2 | 1/2010 |
| WO | WO-2014020817 A1 | 2/2014 |

OTHER PUBLICATIONS

Baldo, "Very high-efficiency green organic light-emitting devices based on electrophosphorescence," Applied Physics Letters, vol. 75, No. 1, pp. 4-6, Jul. 5, 1999.

Hack, et al., "Novel Two Mask AMOLED Display Architecture", SID 2014 Digest; pp. 567-569.

Han, Chang-Wook, "Invited Paper: 15-inch RGBW Panel Using Two-Stacked White OLED and Color Filter for Large-Sized Display Applications".

International Search Report and Written Opinion dated Nov. 10, 2015 in corresponding International Application No. PCT/US2015/032672., dated Nov. 10, 2015.

Kim, et al., "Highly enhanced light extraction from organic light emitting diodes with little image blurring and good color stability", Organic Electronics 17, 2015, 115-120.

Li, Phengui, "Evaporative Self-Assembly of Gold Nanorods into Macroscopic 3D Plasmonic Superlattice Arrays" avail. in Advanced Materials vol. 28, Iss. 13 (p. 2511-2517).

Martin, B. Cao, "A comparative study of hillock formation in aluminum films", received Dec. 2, 1994 vol. 271 Issue 1-2 (p. 64-68).

Nikolov, "Samsung Galaxy S6 review—a bunch of innovs. in a beaut. body", laptopmedia.com/reviews/samsung-galaxy-s6-review-a-bunch-of-innovations-in-a-beautiful-body, Mar. 25, 2015.

Niu, Xiaobin, "The Smallest Metallic Nanorods Using Physical Vapor Deposition" vol. 110 Issue 13.

Shao, Lei, "Comparison of the plasmonic performances between lithographically fabricated and chemically grown gold nanorods" vol. 17, Issue 16.

Wood, "MacAdam Ellipses", Protocol, 2010, 15-18.

Chinese Office Action for Application No. CN201710631488.1, dated Mar. 9, 2020, 9 pages.

* cited by examiner

VERY HIGH RESOLUTION STACKED OLED DISPLAY

CROSS-REFERENCE TO RELATED APPLICATIONS

This application is a non-provisional of U.S. Patent Application Ser. No. 62/367,934, filed Jul. 28, 2016, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to full-color display panels and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

As used herein, a "full color" display or device is one that is capable of producing a full spectrum of visible light by having addressable sub-pixels of at least three primary colors. The light produced by a display may not be the same color or colors as the light initially emitted by one or more emissive materials, layers, or regions of the device. For example, a conventional white-emitting OLED generally is not considered a "full color" device unless it is used in conjunction with other components, such as color filters, that convert the white light produced by the device into individual colors.

As used herein, a "red" layer, material, region, or device refers to one that emits light in the range of about 580-700 nm; a "green" layer, material, region, or device refers to one that has an emission spectrum with a peak wavelength in the range of about 500-600 nm; a "blue" layer, material, or device refers to one that has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy. Two components, such as two emissive regions, layers, materials, or devices are considered to have the "same color" if they emit light having a peak wavelength within the same range as disclosed herein. For example, two emissive regions may both be described as "red" and thus described as having the "same color" if both regions emit light having a peak wavelength in the range of about 580-700 nm.

SUMMARY OF THE INVENTION

In an embodiment, a full-color display is provided that includes a first continuous independently addressable organic emissive layer and a second continuous addressable organic emissive layer disposed over the first continuous addressable organic emissive layer. The emissive layers may be any desired color, such as a blue emissive layer and a yellow emissive layer. The display may include exactly two independently addressable organic emissive layers, and/or continuous organic emissive layers of exactly two colors. The first and second continuous addressable organic emissive layers may be concurrently independently addressable. A conductive layer, which may be transparent with an absorption of 30% or less within the 450-700 nm visible range, may be disposed between the first and second emissive layers to provide electrical connections for a plurality of sub-pixels. An electrode layer, which may include multiple electrodes, may be disposed below the first continuous independently emissive layer. One or more of the electrodes may include projections that extend between the electrode and the conductive layer. The plurality of electrodes may define a plurality of sub-pixels. For example, each electrode may define a sub-pixel. Sub-pixels may have different optical path lengths, such as where a different path length is used for different colors of sub-pixels. A patterned third organic layer may be disposed over at least a portion of the electrodes in the electrode layer. The patterned emissive layer may include an emissive material having a peak wavelength of a different color than a peak wavelength of the patterned first continuous addressable organic emissive layer. One or more color altering layers may be used. For example, a first color altering layer disposed in a stack with a first region of the first continuous addressable organic emissive layer, and/or a second color altering layer disposed in a stack with a second region of the first continuous addressable organic emissive layer that is distinct from the first region of the first continuous addressable organic emissive layer. Each sub-pixel within the device may have a separate backplane circuit, or multiple sub-pixels may be electrically connected to and controlled by a common backplane circuit. The display may have less than one backplane circuit per sub-pixel. The display may include two backplanes, with each of the first and second continuous addressable organic emissive layers being in signal communication with, and controlled by, one backplane. A color altering layer, such as a deep blue color altering layer, may be disposed in a stack with the one of the continuous addressable organic emissive layers and not with the other. The display may include sub-pixels of at least four colors. An outcoupling component may be optically coupled to at least a portion of the display and disposed in a stack with at least one of the electrodes, such as in a stack with one color of sub-pixel. The display may be incorporated into a wide variety of devices, such as a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a 3-D display, a virtual reality or augmented reality display, a vehicle, a large area wall, a theater or stadium screen, a sign, or the like. In a specific configuration, the display may include a first electrode layer that includes a plurality of first electrodes, a conductive layer disposed over at least one of the plurality of first electrodes, the conductive layer having a plurality of vertical protrusions that extend above an upper boundary of the first continuous independently addressable organic emissive layer, a second electrode layer disposed between the first and second continuous independently addressable organic emissive layers, where the plurality of vertical protrusions extend into the second electrode layer; and a third electrode layer disposed over the second organic emissive layer; in which electrodes within each of the first, second, and third electrode layers are independently addressable.

In an embodiment, a method of fabricating a full-color display is provided. The method may include disposing a first electrode layer comprising a plurality of first electrodes over a substrate; fabricating a conductive layer comprising a plurality of vertical protrusions over at least one of the plurality of first electrodes; fabricating a blanket first organic emissive layer disposed over at least a portion of the first plurality of electrodes, wherein the plurality of vertical projections extend above an upper boundary of the first organic emission later; fabricating a blanket second organic emissive layer disposed over the first organic emissive layer; fabricating a second electrode layer disposed between the first and second organic emissive layers, wherein the plurality of vertical protrusions extend into the second electrode layer; and fabricating a third electrode layer disposed over the second organic emissive layer. Electrodes within each of the first, second, and third electrode layers may be independently addressable via an electrical connection external to the arrangement. The method may further include fabricating a patterned third organic emissive layer disposed over at least a portion of the first plurality of electrodes, wherein the patterned third organic emissive layer comprises an emissive material having a peak wavelength of a different color than a peak wavelength of the patterned first organic emissive layer. The patterned third organic emissive layer may not be disposed over the patterned first organic emissive layer.

In an embodiment, a full-color display is provided that includes a first continuous independently addressable organic emissive layer and a second continuous independently addressable organic emissive layer disposed over the first continuous addressable organic emissive layer, in which the first and second continuous addressable organic emissive layers are concurrently independently addressable. The first continuous independently addressable organic emissive layer may be disposed over a first substrate, and the second continuous independently addressable organic emissive layer may be disposed over a second substrate. The first substrate may be disposed over the second substrate. The first emissive layer may be disposed over a first portion of a flexible substrate, and the second continuous independently addressable organic emissive layer may be disposed over a second portion of the flexible substrate, i.e., the first and second substrates may be a single continuous flexible substrate. The first independently addressable organic emissive layer may be disposed over the second independently addressable organic emissive layer, such as where two substrates are placed in a stacked configuration, or where a single flexible substrate is curved or bent to place one emissive layer over the other. The display may include exactly two independently addressable organic emissive layers. An electrode layer including a plurality of electrodes may be disposed below the first continuous independently emissive layer. The electrodes may define a plurality of sub-pixels, such as where each electrode defines a single sub-pixel. Different sub-pixels within the display may have different optical path lengths. The display may include a single set of data lines. The display may include organic emissive layers of exactly two colors. One or more color altering layers may be disposed in a stack with regions of the first continuous addressable organic emissive layer The display may have less than one backplane circuit per sub-pixel. The display may have a first backplane and a second backplane, with the first continuous addressable organic emissive layer being in signal communication with, and controlled by, the first backplane and the second continuous addressable organic emissive layer being in signal communication with, and controlled by, the second backplane. The first and second emissive layers may comprise blue and yellow, or yellow and blue emissive materials, respectively. The first continuous addressable organic emissive layer may be disposed between a first backplane and the second continuous addressable organic emissive layer, and the second continuous addressable organic emissive layer may be disposed between a second backplane and the first continuous addressable organic emissive layer. The display may be incorporated into a variety of devices, such as a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a 3-D display, a virtual reality or augmented reality display, a vehicle, a large area wall, a theater or stadium screen, a sign, or the like.

In an embodiment, a method of fabricating a full-color display is provided, which includes fabricating a first continuous independently addressable organic emissive layer of a first color over a first substrate; fabricating a second continuous independently addressable organic emissive layer of a second color over a second substrate, wherein the second color is different than the first color; and placing the first substrate over the second substrate. The second substrate may be the same substrate as the first substrate, and the step of placing the first substrate over the second substrate may include bending the first substrate at a point between the first and second continuous independently addressable organic emissive layers. Alternatively, the second substrate may be physically separate from the first substrate prior to placing the first substrate over the second substrate.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
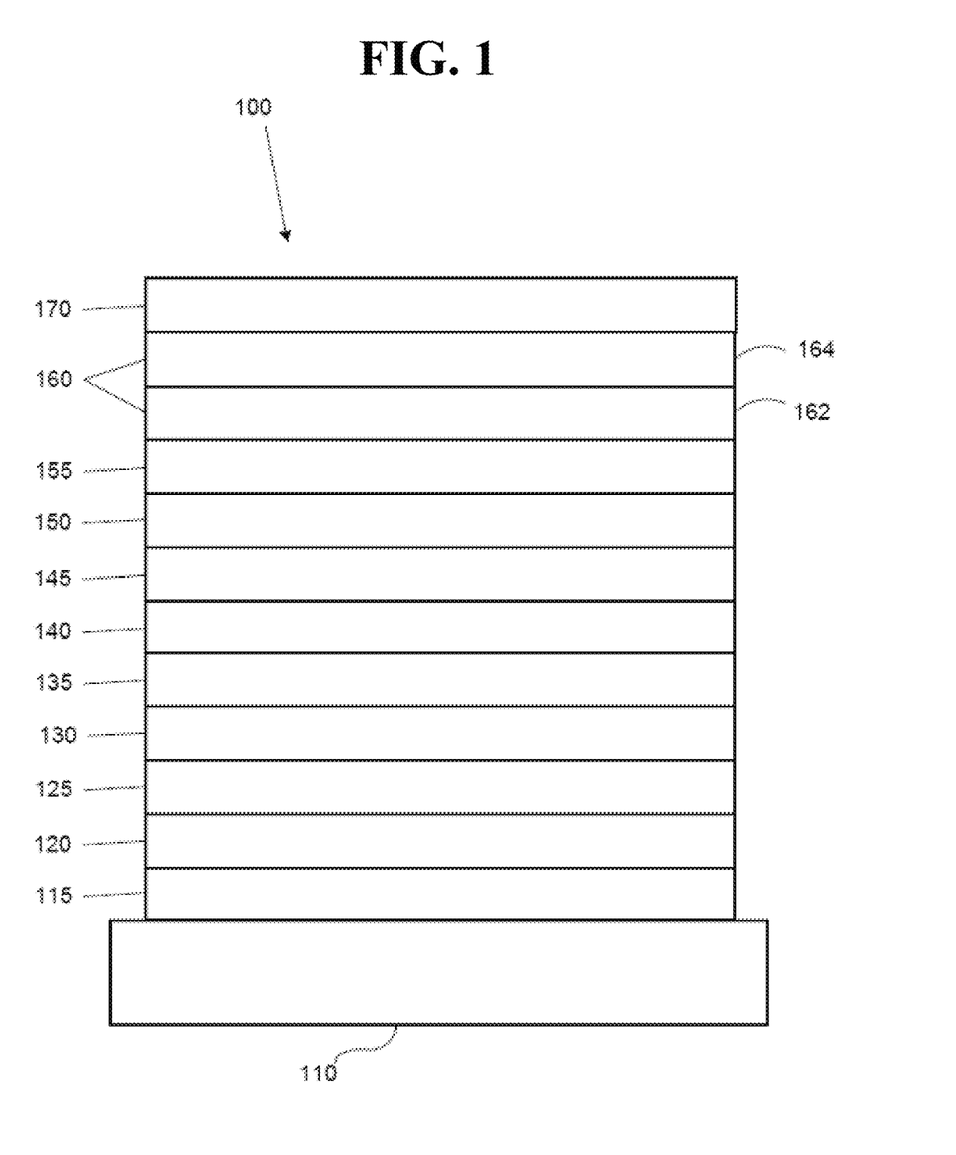
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
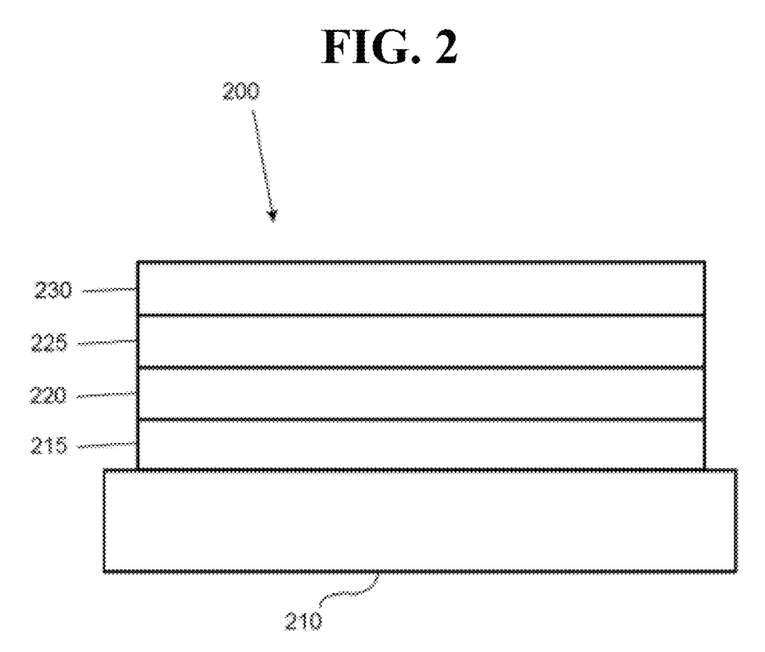
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays less than 2 inches diagonal, 3-D displays, virtual reality or augmented reality displays, vehicles, video walls comprising multiple displays tiled together, theater or stadium screens, and signs. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to +80 C.

Recent OLED research has developed techniques for fabricating a full-color OLED display panel using separately-addressable yellow and blue OLED stacks. In such techniques, one high resolution masking step may be used to ensure that a middle electrode can be externally and independently driven from the backplane. Such a display architecture may be useful for high resolution OLED displays which require long display lifetimes, high brightness and low power consumption. Typically, red and green sub-pixels are achieved through the use of color filters. This approach generally has several performance advantages when compared to a conventional arrangement that uses a white OLED stack and multiple color filters. Color filters in a conventional white stack generally reduce light output for each color, thereby reducing the display efficiency and potentially also the blue lifetime because the blue fill factor is effectively relatively low, so increased luminance is needed to compensate. It also may be difficult to optimize a white top emission cavity for all three colors, thereby lowering performance. Blue color filters also typically cannot completely cut out deep green, so only yellow-green emitters are used, further lowering the efficiency of any deep green sub-pixels.

Disclosed herein are techniques and arrangements that use a limited number of emissive depositions, while avoiding the need for high resolution masking. In embodiments disclosed herein, multiple OLED stacks may be continuous across the active layer. For example, in a yellow- and blue-based devices, both the yellow and blue depositions may be continuous across the active area of a full-color display. To achieve such an arrangement, a patterned metal such as Al, Ag, or the like may be deposited on anodes dedicated to the blue sub-pixels. With appropriate heating or other processing, spikes will form that will electrically connect the blue anodes to the middle transparent conductive electrode. For example, it has been found that for a single 300° C. Al deposition, approximately 30-50% of the total hillock population were at least 100 nm in height; approximately 10% were at least 200 nm; and less than 1% were equal to or greater than 500 nm. Further coatings of metal may be made over the initial features to increase the size and height.

Alternatively or in addition, metal nanorods, such as Au or Ag nanorods, may be formed on the surface of a sub-pixel electrode. For example, in an embodiment such nanorods may be fabricated or otherwise disposed on the blue anode, i.e., the anode controlling the blue sub-pixel. The nanorods can be formed by a number of methods, including lithographic masking and solution printing techniques such as ink jet printing. In either case, the density and height of the nanorods is predictable in the height desired for fabricating the shorting layer, and can be well controlled and determined. Dimensions of nanorods known in the art indicate that they may be used to connect the blue anode to the middle conductive transparent electrode reliably without shorting to the top cathode.

After the blue anode is connected to the central conductive transparent electrode, additional steps and/or structures may be desirable to prevent the hillocks, rods or spikes, from shorting the central electrode to the cathode, i.e., by shorting the upper blue OLED stack. Various structures and techniques may be used to prevent such shorting.

For example, a thick HTL may be fabricated or placed in the upper blue stack. to prevent the metal spikes from the blue anode from reaching the cathode. To avoid a voltage increase, the HTL may be conductivity doped. In such a configuration, the HTL thickness may be 10-300 nm or more.

As another example, a relatively thin, continuous, medium-resistance cathode may be used in combination with very low resistance buslines that are patterned over the substrate away from the blue anodes. For example, the sheet resistance may be greater than about 1 KΩ/square and less than about 100 KΩ/square. If the blue anode does short through to the cathode, this arrangement will act as an effective resistor between the short and a low resistance cathode bus line, thereby localizing the effect of the short to one set of blue pixels. In many cases this not be visually apparent given the eye's low-resolution sensitivity to blue.

As another example, a non-conductive organic or inorganic film may be evaporated over the display through a mask to coat the areas of the display over the blue anode connections. The evaporated region may be larger than the blue anode, but may be a relatively small portion of the overall pixel area of a display, such as no more than about 20% of the pixel area. A continuous conductive cathode also may be fabricated over the display. The upper blue OLED formed over the blue anode contact will therefore have no electrical connection to the cathode, thereby preventing shorting. The evaporated non-conducting film may be sufficiently thick to physically prevent the anode spikes from connecting with the cathode. The particular mask required for such a protective evaporation generally will be less critical than the mask that would be needed for a conventional emissive layer patterning. For example, the mask may have only small openings relative to the pixel size. Furthermore, there may be no need to prevent or address overspill from one ELM to a neighbor as in a conventional FMM process, so the mask can be thicker and the openings will not need to be tapered. Accordingly, masks used in such a process will be cheaper, less complex, and longer-lived with less of a cleaning requirement than would be expected for conventional emissive depositions. Alternatively, a process such as LITI, OVJP, or the like may be used to provide a similar film, without the use of a masking step.

Figure 3A:
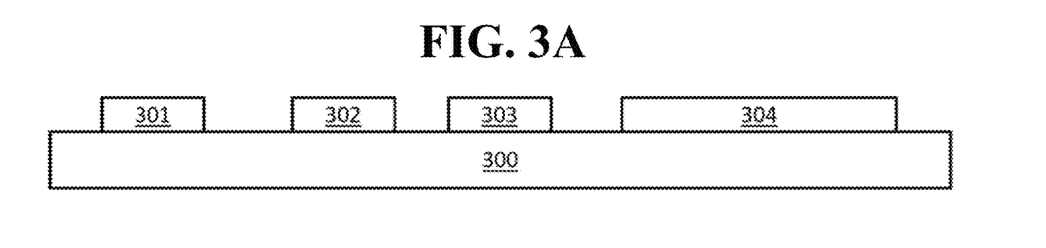
FIGS. 3A, 3B, 3C, 3D, 3E, 3F, 3G, and 3H show example fabrication process steps and resulting structures for a display architecture according to embodiments of the invention.

FIGS. 3A-3G show an example fabrication process and associating structure according to an embodiment of the invention. In FIG. 3A, a patterned layer electrode layer, such as an anode layer, is deposited or otherwise disposed over a substrate 300. The electrode layer may include multiple sub-pixel electrodes, such as for providing electrical contact to each of the blue, red, green, and/or yellow sub-pixels, e.g., sub-pixel anodes 301, 302, 303, 304, respectively. Each sub-pixel associated with the sub-pixel electrodes 301-304 may be individually addressable. For example, the electrodes 301-304 may each be connected to a backplane circuit for active-matrix addressing. Alternatively, multiple electrodes 301-304 within a single pixel or within multiple pixels may be connected to a common backplane circuit. For bottom-emission devices, red and green color-altering layers, such as color filters, also may be fabricated vertically adjacent to, or otherwise in a stack with, the red and green sub-pixel electrodes 302, 303. The electrode layer may be a patterned layer, i.e., one that includes designated and areas of electrode material that repeat in a set pattern across the area of a substrate. Alternatively or in addition, the electrode layer may include one or more blanket depositions of electrode material that are separated by previously-defined insulating regions. More generally, any suitable arrangement and technique of sub-pixel electrode deposition and/or fabrication may be used. Although the drawings provided herein show sub-pixels for one or a small number of pixels, one of skill in the art will readily understand that the arrangement may be repeated and extended to provide an arbitrarily large OLED panel including any desired number of pixels.

Figure 3B:
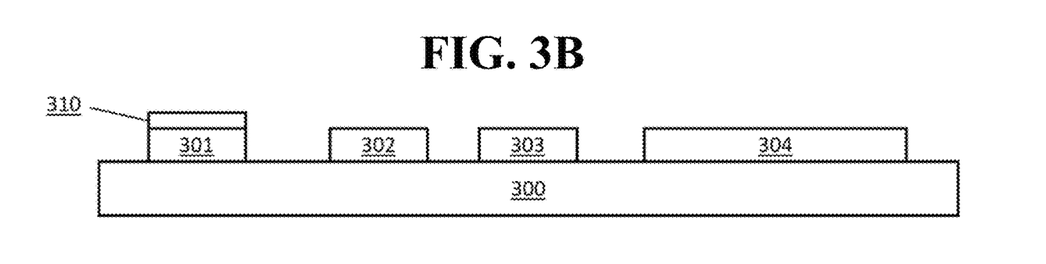
Figure 3C:
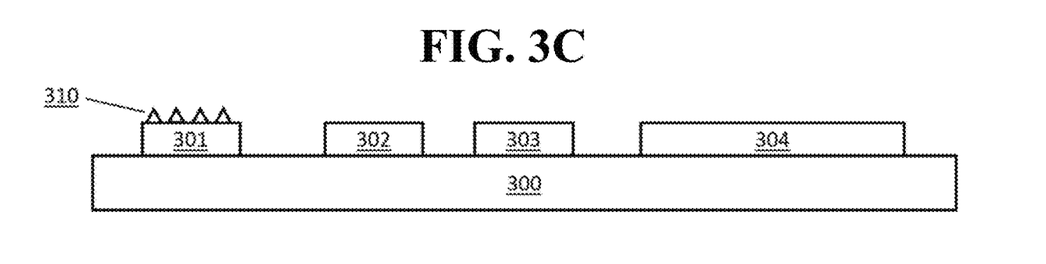

In FIG. 3B, a metal layer 310 may be fabricated over one color of sub-pixel electrodes, such as the blue electrodes 301. Upon heating or other treatment, the metal layer may form into one or more hillocks that extend away from the sub-pixel electrode 301. Alternatively or in addition, metal nanorods or similar structures may be fabricated or disposed over the electrode 301. FIG. 3C shows a schematic representation of the metal layer after heating or other treatment to cause such hillocks. The metal layer 310 may be altered, such as through heat treatment, to include hillocks, or similar structures may be fabricated or disposed over the sub-pixel electrode 301 as previously disclosed.

Figure 3D:
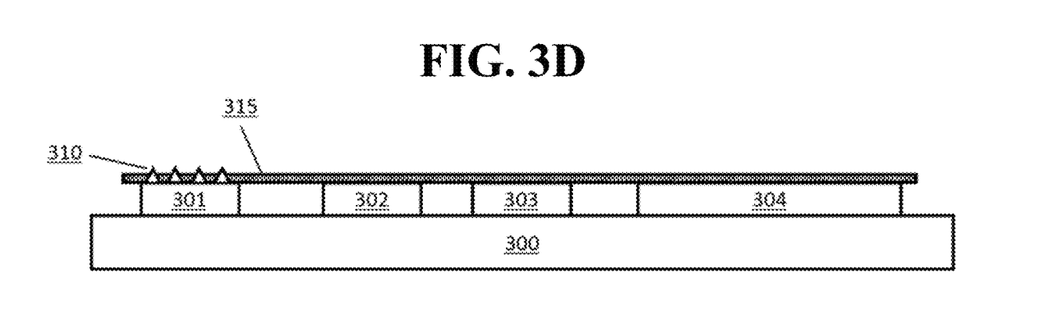

A continuous or "blanket" layer of emissive material may be disposed over the layer of sub-pixel electrodes, such that the hillocks or other protrusions extend through the material. The layer also may include additional non-emissive materials, such as transport layers. The layer may be a continuous layer or series of continuous layers that extends, for example, unbroken across the entire region of the substrate over which all sub-pixel electrodes for one or more pixels are positioned, i.e., across the entire active area of a portion of a display associated with one or more pixels. For example, a continuous emissive layer may extend across an entire OLED display panel without breaks. FIG. 3D shows such an arrangement in which a blanket yellow layer 315 is disposed over the sub-pixel electrodes 301, 302, 303, 304. The protrusions of the metal layer 310 disposed over the blue sub-pixel electrode 301 extend above the continuous blanket yellow layer 315. The continuous emissive layer 315 and any associated non-emissive layers may be transparent or semi-transparent. For example, the emissive layer 315 may have an absorption of not more than about 30% in the 450-700 nm wavelength range.

Figure 3E:
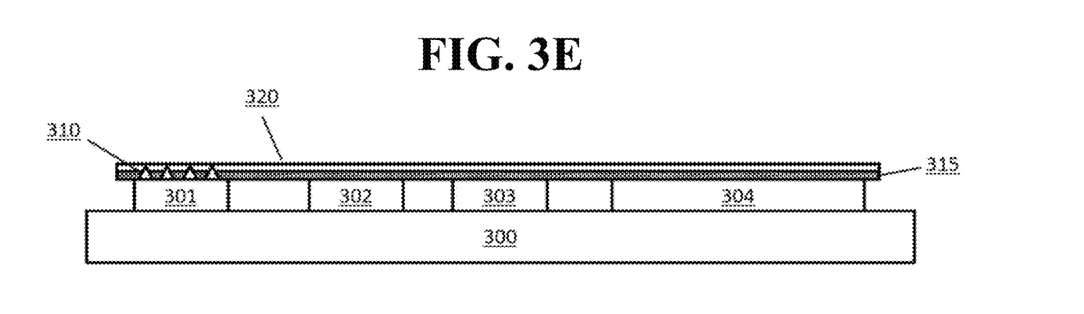

A conductive layer or layers may then be disposed over the blanket emissive layer 315 to provide a middle or central electrode. FIG. 3E shows a configuration in which a middle electrode 320 is disposed over the blanket emissive layer 315. The metal protrusions 310 extend through the blanket emissive material layer 315 to contact the middle electrode 320, thereby shorting the portion of the blanket emissive layer over one sub-pixel electrode 301. In this example, the region over the blue sub-pixel electrode 301 is shorted between the anode and the conductive layer 320. This effectively extends the blue sub-pixel electrode above the blanket yellow layer 315 without requiring the use of a mask as would be the case in conventional techniques and arrangements. The conductive layer 320 may be transparent; for example, it may have an absorption of not more than 30% in the visible 450-700 nm wavelength range.

Figure 3F:
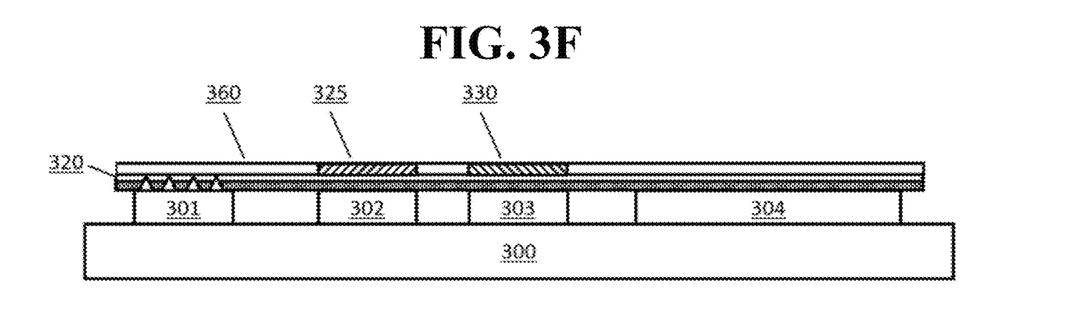

One or more additional blanket emissive material layers may be disposed over the middle electrode. As previously disclosed, additional non-emissive layers such as transport layers that operate in conjunction with the emissive layer also may be disposed over the middle electrode. More generally, although emissive layers are shown as single layers for ease of illustration, it will be understood that the emissive layers typically will be implemented in emissive stacks, i.e., with associated electrodes and other organic layers such as transport layers, blocking layers, and the like, as disclosed with respect to FIGS. 1 and 2. For example, a blanket layer of emissive material of the same color as the sub-pixel shorted in FIG. 3E may be disposed over the electrode. Such an arrangement is shown in FIG. 3F. In this example, a blanket layer of blue emissive material 360 is disposed over the middle electrode 320. Notably, as with the yellow blanket layer 315, the layer may be deposited without the use of a mask. The particular colors of emissive layers disclosed and illustrated herein are illustrative only, and various other combination may be used. For example, the blanket layer 315 may be a blue emissive layer and the blanket layer 360 may be a yellow emissive layer. Furthermore, combinations other than yellow and blue for the blanket continuous emissive layers 315, 360 may be used. For top-emission devices, one or more color filters 325, 330 may be disposed over the associated sub-pixel electrodes 302, 303, respectively. For example, a red color filter 325 may be disposed over a red sub-pixel electrode 302, and a green sub color filter 330 may be disposed over a green sub-pixel electrode. The color filters 325, 330 may be incorporated into the blanket layer 360 or disposed over the blanket layer 360 using techniques known in the art. One or more thin film encapsulation layers also may be fabricated or otherwise disposed over one or more of the sub-pixels, such as in a stack either over or under one or more of the color filters.

Figure 3G:
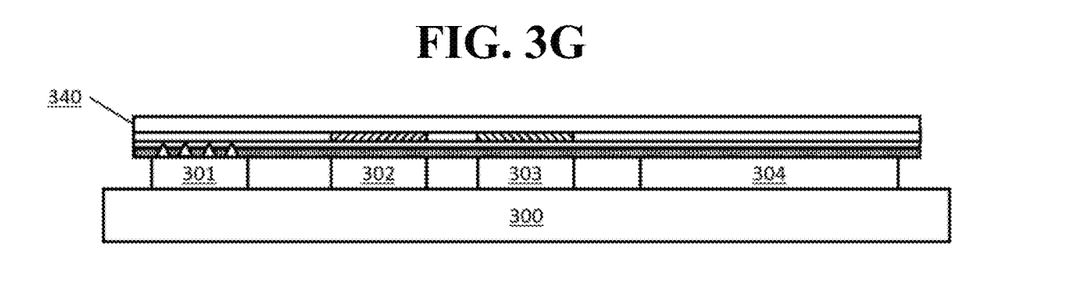

FIG. 3G shows a complete device according to embodiments of the invention, including a blanket top electrode 340 such as a cathode.

Figure 3H:
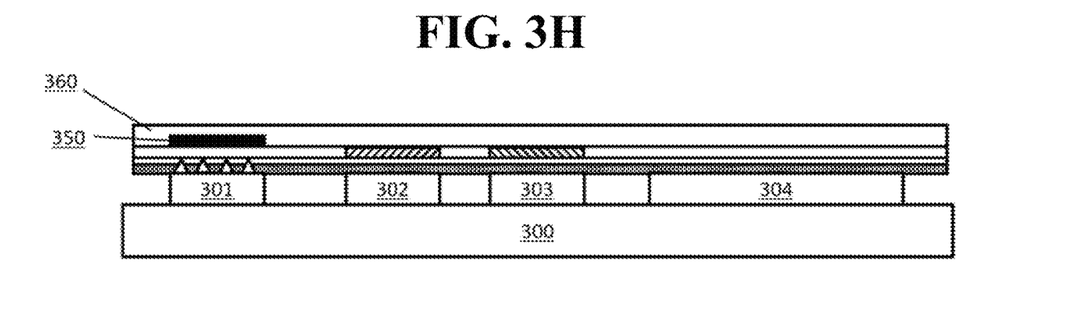

As previously disclosed, in some cases it may be desirable to include additional features to further prevent shorting of the blue sub-pixel above the associated sub-pixel electrode. For example, FIG. 3H shows an example in which a non-conducting organic layer 350 or similar structure is disposed over the blue sub-pixel electrode 301 prior to the blanket cathode 340 being disposed over the pixel.

Each of the blanket emissive layers 310, 360 may become part of OLED sub-pixels that are independently addressable, and as such may be referred to as "independently addressable" layers. As used herein, a layer or region of emissive material is "independently addressable" if it can be addressed separately and independently from any other layer or region of emissive material within a particular device or portion of a device. In some cases an "independently addressable" layer may include multiple sub-layers or multiple emissive materials. For example, a yellow emissive layer may include red and green emissive materials, or red and green emissive sub-layers, such as where the yellow layer is formed by first depositing a green or red sub-layer, followed by the complementary red or green sub-layer. Within such layers, it is not possible to individually activate the sub-layers or individual emissive materials separately from the other sub-layers or materials. Accordingly, while the emissive layer may be independently addressable, each sub-layer or material is not independently addressable.

However, within a device as disclosed herein, the separate continuous blanket layers 310, 360 may be independently addressable due to the presence of the middle electrode 320. This configuration is in contrast to a device such as a white device that includes multiple layers that cannot be independently addressed. For example, a conventional stacked white device may include red, green, and blue emissive layers that are controlled by a single set of electrodes. Accordingly, the red, green, and blue emissive layers within the stacked white device cannot be individually activated separately from one another and, therefore, cannot be independently addressable. More generally, conventional white devices do not include any individually addressable layers and the device may only be addressed as an entire white-emitting device.

In embodiments disclosed herein, an "independently addressable" layer may include multiple portions arranged over a plurality of electrodes, each of which portion is independently addressable. Such portions are distinguished from, for example, the sub-layers of a white device, because they are associated with separate and independent electrodes. For example, FIGS. 3A-3H show sub-pixels that emit red and green light using color filters 325, 330. Each sub-pixel includes an associated sub-pixel electrode 302, 303, respectively, disposed in the electrode layer. Each of the electrodes 302, 303 is controllable independently of the other, and independently of other electrodes in the pixel and the device. Accordingly, those portions of the blanket continuous yellow layer 360—i.e., the red and green sub-pixels—are independently addressable relative to one another.

In some embodiments, spatial resolution techniques may be used to reduce the relative number of color filters used, such as by sharing one anode of a particular color among multiple pixels. For example, following the previous examples in which yellow and blue blanket layers are used in combination with red and green color filters to achieve red, green, blue, and yellow sub-pixels, blue anode contacts may be shared among four sub-pixels. Because the eye has lower spatial resolution to blue, it may be desirable for one blue anode connection, and therefore one blue sub-pixel, to be shared between multiple pixels. This may allow for more efficient arrangements with minimal or no loss in apparent quality or resolution.

Figure 4:
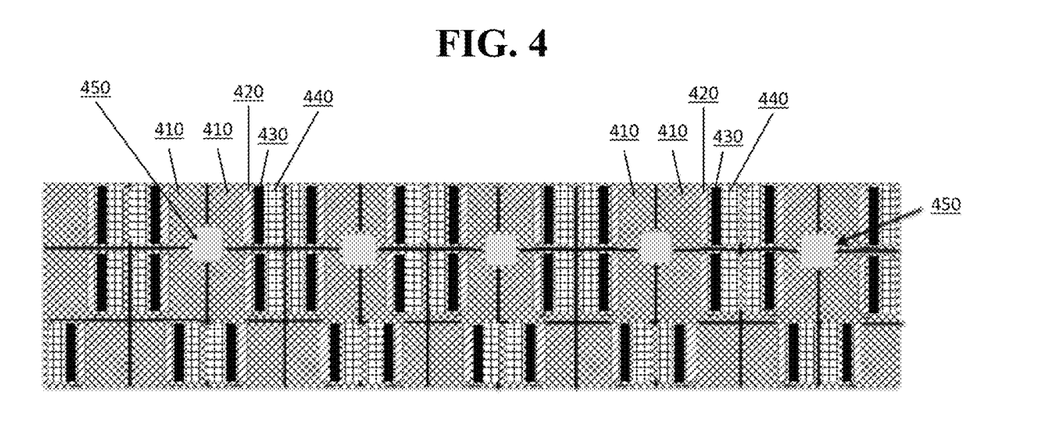
FIG. 4 shows a top schematic view of a portion of a full-color OLED display panel according to an embodiment of the invention.

An example of such an arrangement is shown in FIG. 4. In this example, blue anode contacts 450 are shared among the blue sub-pixels of four pixels as shown. The device includes blue sub-pixels 410, red sub-pixels 420, green sub-pixels 430, and yellow sub-pixels 440. Such a device may have the layered structure shown and described with respect to FIGS. 3A-3H or variations thereof. Notably, the structure may be fabricated without the use of fine masks as previously disclosed.

Although described with respect to top-emitting examples, embodiments disclosed herein may include both bottom and top emission display architectures. Regardless of the specific architecture used, the thicknesses of the yellow and blue emissive layers and/or the position of the respective emissive layers relative to the bottom and top contacts may be tailored to achieve favorable optical cavities for each color. For example, the thicknesses of the various layers disclosed may be tailored to provide a microcavity suitable for providing deep blue emission.

More generally, some embodiments may include one or more organic layers, which may be patterned to correspond to the sub-pixel electrodes of the electrode layer as previously disclosed. Such layers may be configured to provide a desired optical path length for any of the sub-pixels of the device. For example, in some embodiments, the optical path length for a particular color sub-pixel may be selected to provide a tuned color for the sub-pixel. As a specific example, the optical path length for a blue sub-pixel may be selected to provide deep blue emission. Furthermore, organic material used to create a particular optical path length may be emissive or non-emissive. As previously disclosed, such material may be a HTL or similar material. Alternatively or in addition, emissive material may be used, for example to augment the emission of a particular sub-pixel. Different sub-pixels may have different optical path lengths within a pixel or a device.

Notably, embodiments disclosed herein may include emissive layers of not more than two colors. For example, the arrangement shown in FIGS. 3A-3H includes only blue and yellow emissive layers. In this example configuration, red and green sub-pixels are provided by a combination of the yellow emissive layer and suitable color filters or other color altering components. As noted above, although an emissive layer such as a yellow emissive layer may include sub-layers, such as green and red sub-layers, the yellow layer is still considered a single emissive layer as disclosed herein because the arrangement of components does not allow for the green or red sub-layers to be activated separately from the other. That is, the yellow emissive layer emits yellow light only. Although this light may be converted to red or green light through the use of color filters, it is not possible for the blanket yellow layer to emit green or red light separately without the use of a color altering component. A configuration as disclosed herein that includes only two continuous organic emissive layers while still providing a full-color device may be desirable over conventional arrangements since the device is much less complex, and does not require the use of masking techniques to fabricate the device.

In some embodiments, an outcoupling component may be optically coupled to one or more of the sub-pixels of the device. For example, a microlens array may be disposed above or below one or more sub-pixels, depending upon whether the device is a top- or bottom-emitting device, to further increase the amount of light emitted by the sub-pixel. As used herein, an "outcoupling component" refers to a component that outcouples light from an OLED. To perform outcoupling, a component must, when optically coupled to an emissive region of an OLED either directly or indirectly, result in more light exiting the OLED than otherwise would exit the OLED in the absence of the outcoupling component. Examples of outcoupling components include microlens arrays of any size, shape, and arrangement.

Embodiments disclosed herein, such as those shown in FIGS. 3-4, may be driven using driving schemes that are particularly adapted to the device arrangement. For example, the middle conductive layer 320 shown in FIG. 3 may act as a cathode for some sub-pixels in the device, and as an anode for other sub-pixels in the device. A drive scheme for such an arrangement may alternate between addressing each organic emissive layer, such that the sub-pixels for which the conductive layer acts as a cathode are addressed sequentially, i.e., non-concurrently, with the sub-pixels for which the conductive layer acts as an anode. Examples of suitable driving schemes are disclosed in U.S. application Ser. No. 15/172,888, filed Jun. 3, 2016, and U.S. application Ser. No. 15/169,027, filed May 31, 2016, the disclosure of each of which is incorporated by reference in its entirety.

Embodiments disclosed above with respect to FIGS. 3-4 use two continuous, independently addressable emissive layers, for example, one yellow and one blue. Both emissive layers are unpatterned at the pixel level and are disposed in separate planes within a device. In some embodiments, such an arrangement may be used to provide high to very high resolution displays with resolutions of, for example, 1,000 dpi or more. Pixel dimensions for such displays typically will be will be less than about 25 microns. To avoid parallax issues, the planes in which the emissive layers are disposed may be located relatively close to one another, for example, with a separation of not more than about 25 μm in the z-direction, relative to the display surface being an xy plane, i.e., normal to the substrate surface. Many substrates are thicker than 100 μm, which indicates that either the two emissive planes should be stacked on the same side of a single substrate, or placed on two different substrates, joined together with the sides onto which the emissive layers have been deposited facing each other.

In some cases, such as for small-area, high resolution displays for applications such as virtual reality or augmented reality, the substrate and backplane cost may be only a small fraction of an overall display cost in comparison to the costs of OLED depositions, row and column drivers, timing controller circuits, video processing, circular polarizers and touch panels, and other system components.

Figure 5:
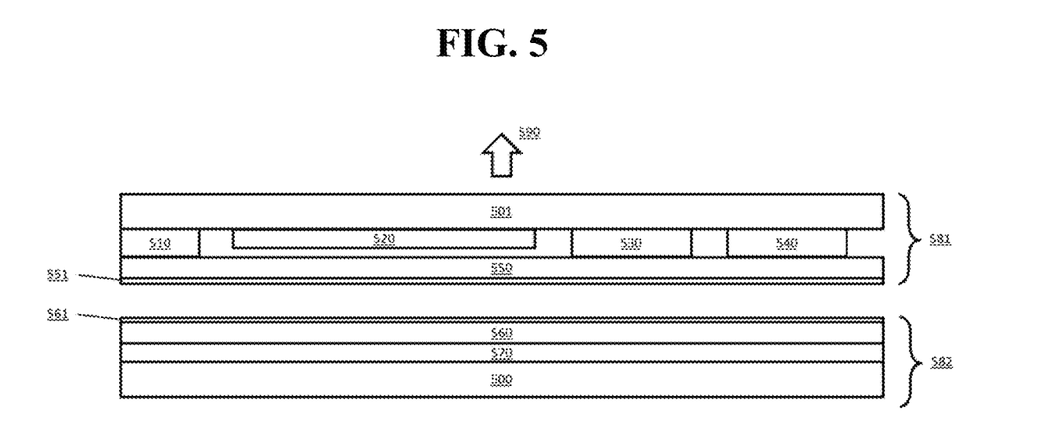
FIG. 5 shows an example of a device having two substrates according to an embodiment of the invention.

In this and other situations, a high resolution display may be provided using multiple substrates. FIG. 5 shows an example of such a device. The device includes two substrates 500, 501, on which are deposited two continuous, individually-addressable organic emissive layers 550, 560. As previously disclosed, these blanket layers 550, 560 may be, for example, blue and yellow emissive layers. Although single layers are shown in FIG. 5 for ease of illustration, it will be understood that the emissive layers typically will be implemented in emissive stacks, i.e., with associated electrodes and other organic layers such as transport layers, blocking layers, and the like, as disclosed with respect to FIGS. 1 and 2. Sub-pixels of other colors, such as red and green, may be provided through the use of color filters 530, 540 or other color altering layers, or by the use of varied optical path lengths within the device as previously disclosed. In an example device, the unpatterned yellow emissive layer is deposited on to one substrate, and an unpatterned blue emissive layer is deposited on to a second substrate. Each substrate 500, 501 may have its own associated backplane 570, 520, respectively. In comparison to a structure as described with respect to FIG. 3, there are no additional OLED costs associated with the device shown in FIG. 5. However, there may be additional or different costs due to the use of two backplanes and possibly only one set of column drivers for example as described with respect to FIG. 7. Each blanket emissive layer 550, 560 may have a thin film or other suitable encapsulation 551, 561. The color filters 530, 540 disposed on one substrate 501 may be selected to complement the color emitted by the blanket emissive layer disposed on the other substrate 560. For example, for a yellow-emitting blanket emissive layer 560, the color filters 530, 540 may be red and green, so as to provide a full-color device having 3, 4, or 5 sub-pixels.

Figure 6:
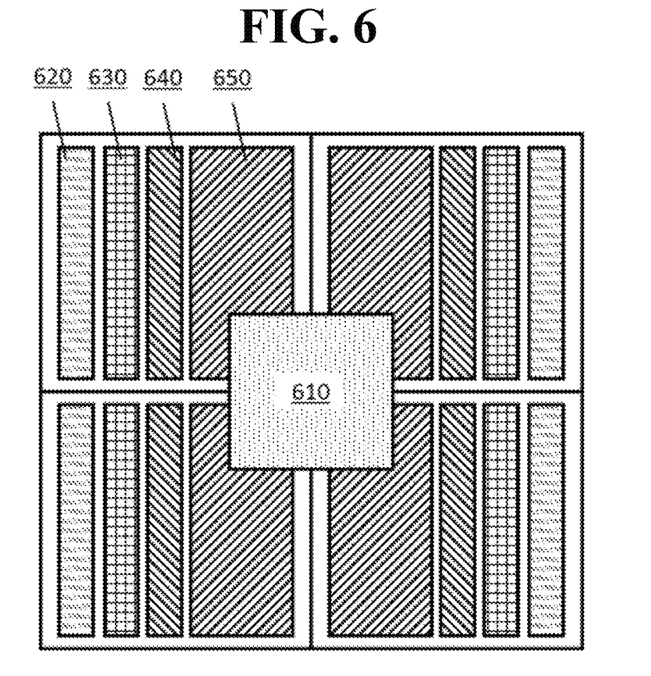
FIG. 6 shows an example pixel arrangement in which a deep blue sub-pixel is shared among four pixels according to an embodiment of the invention.

As further described herein, in some embodiments a color filter 510 may be used that is the same or a similar color as the associated emissive layer 550. For example, the color filter 510 may be a deep blue color filter that converts blue or light blue light emitted by the blanket emissive layer 550 into deep blue light that is emitted from the device at 590. As shown in FIG. 6 and as disclosed in further detail herein, in such a configuration a portion of the blanket emissive layer 550 may remain unfiltered, for example to provide light blue light, while a portion of the emissive layer is disposed in a stack with the color filter 510, such as to provide deep blue light.

In an embodiment, the two substrates 500, 501 may be disposed such that the independently-addressable emissive regions are facing each other. In this case, one one OLED stack 582 may be configured as a top-emitting device, and one stack 581 may be transparent. The combined light thus will propagate in a single direction 590. Furthermore, if a blue-emitting stack is configured for top emission, then deep blue emitted light may be obtained by including a microcavity or color filter in the stack as previously disclosed and allowing the light to pass through a transparent yellow-emitting stack. However, the yellow-emitting stack typically includes at least 3 sub-pixels (yellow, green and red) as previously described and shown in FIG. 3 and as previously described with respect to FIG. 5. The stack thus includes sufficient circuitry for three sub-pixel circuits, which may reduce the overall transparency of the system. As another example, the yellow-emitting stack may be configured for top emission. In this case only the transmission properties of the blue-emitting stack may be of interest to the final light output of the device. As described in further detail herein, the blue-emitting stack may include only about 1.25 sub-pixel circuits per pixel, as opposed to 3 sub-pixel circuits for a yellow-emitting stack, thus having a much reduced impact on display transmission and aperture ratios.

In some embodiments, such as where a blue-emitting stack is configured as a transparent stack, the blue emission may be insufficiently saturated to meet color gamut or other requirements. Accordingly in some cases it may be advantageous to provide two blue sub-pixels, in which the color of the as-deposited blue emissive layer would be a light blue, and a deep blue is provided using a color filter, microcavity, or other color altering component. Because the deep blue is only used for a small number of images, the resulting lower efficiency is not a significant concern and the light blue may be used to render most images. Furthermore, because the human eye generally cannot resolve high resolution deep blue images, one deep blue sub-pixel may be shared among multiple pixels. An example of such a configuration is shown in FIG. 6. This arrangement includes a single deep blue sub-pixel 610 formed through a combination of portions of light blue sub-pixels 650 and a color altering component such as a color filter. Each pixel also includes separate sub-pixels for green (620), red (630), and yellow (640) emission. Each deep blue sub-pixel may be driven by a data line shared between two rows of pixels, and driven by two consecutive scan lines. Video processing can be adjusted such that each deep blue pixel represents the average of four picture elements. Examples of suitable video processing techniques are disclosed in U.S. Published Patent Application No. 2015/0349034, the disclosure of which is incorporated by reference in its entirety.

A range of thin film transistor backplane technologies may be used to drive a display arrangement as shown in FIG. 5. Both organic and inorganic devices may be used. Examples of suitable materials include low temperature polycrystalline silicon (LTPS), carbon nanotube transistors, oxide transistors, and the like. One consideration for very high resolution displays is that the required transistors may occupy a relatively significant portion of the available pixel area, and any components or conductors that are not transparent may impact the performance of the device. Accordingly, top-emission OLED stack arrangments may be preferred, so that the OLED stack may be placed over the TFT devices and circuits and thereby prevent the backplane from limiting the display aperture.

Another approach to reduce the area occupied by the backplane is to employ a driving scheme as previously disclosed, in which multiplexing techniques are used. This allows the device to include one sub-pixel circuit per pixel, which also may improve display transmission.

Further improvements in display transmission for a transparent backplane may be achieved by using transparent conductors for local interconnects within each pixel, where extremely low resistances are not required. For pixel currents of a few microamperes, local resistances of a few kilohms can be tolerated. In this case various transparent conductors used in the art, such as ITO, IZO, or silver nanotubes, carbon nanotubes, or the like, may be employed.

In some embodiments, such as to provide for high resolution applications, sub-pixel rendering (SPR) concepts may be applied as previously disclosed. For example, only one green or one red sub-pixel may be used per pixel. Each pixel on one substrate will then have a yellow sub-pixel and either a green or red sub-pixel. This reduces the number of column drivers to 2 for that substrate, and either 1 or 1.5 for the other substrate, depending on whether it is top emission (e.g., deep blue) or bottom emission (e.g., light blue) with a shared deep blue sub-pixel. Accordingly, it may be possible to use either substrate as the transparent substrate, due to the relatively small number of column drivers required.

As previously disclosed with respect to FIG. 3, an arrangement as shown in FIG. 5 may include one or more patterned organic layers that provides a different optical path length for one or more sub-pixels. For example, non-emissive organic material may be placed in a stack with one or more of the sub-pixels defined by the color filters 510, 530, 540 and/or other portions of the emissive stacks defined by the blanket emissive layers, such as the unfiltered portion of the emissive layer 550 below the backplane 520 in FIG. 5. As with the arrangements described with respect to FIG. 3, each cavity may be optimized for a specific color depending upon the color desired for the specific sub-pixel.

In some embodiments, one or more of the sub-pixels may be a stacked device. For example, either of the blanket layers may be fabricated as a stacked device that includes multiple emissive layers that are not separately independently addressable. As a specific example, the blue sub-pixel may be a stacked device either by using a stacked device as the blanket layer, or by fabricating an additional blue emissive layer in a stack with the blue sub-pixel electrode. Such additional emissive layer or layers also may serve to provide a desired optical path length as previously disclosed.

In an embodiment, a device architecture as shown in FIG. 5 may include a single set of column drivers. In such an embodiment, scan drivers may scan each backplane in 50% of the frame time. Columns of both emissive stacks, e.g., emissive layers 550, 560 in FIG. 5, may be driven at the same time, with only a single scan line on one backplane selected at any particular time.

In an embodiment, each backplane, e.g., backplanes 520, 570, may be driven independently. As a specific example, in a device having blue and yellow blanket emissive layers as shown in FIG. 5, the backplane for the blue emissive layer may require only one data line per pixel for the light blue sub-pixel, and half a shared data line for the deep blue sub-pixel as previously disclosed. These data lines may be driven from data drive components specifically dedicated to the blue-emitting backplane. Alternatively or in addition, they may use common column drivers as the red, green, and yellow sub-pixels, which may be formed from a blanket yellow emissive layer. Such a configuration may provide lower-cost and -complexity devices than conventional arrangements, especially since simple conventional driver chips may be used. The scan driving circuits for the two devices (i.e., the blue- and yellow-emitting stacks) may be synchronized, so that in each frame time the system may sequentially scan through all the scan lines disposed in the first substrate, followed by all scan lines in the second substrate.

To minimize the package size into which a display can be placed, flexible substrates may be used to allow the ends to be bent back for connections to be made behind the display. For a display architecture with two backplanes as shown in FIG. 5, both displays can be bent in the same direction. External connections may be made to opposite ends of each substrate, with the backplane that is being connected made longer than the other backplane.

Figure 7A:
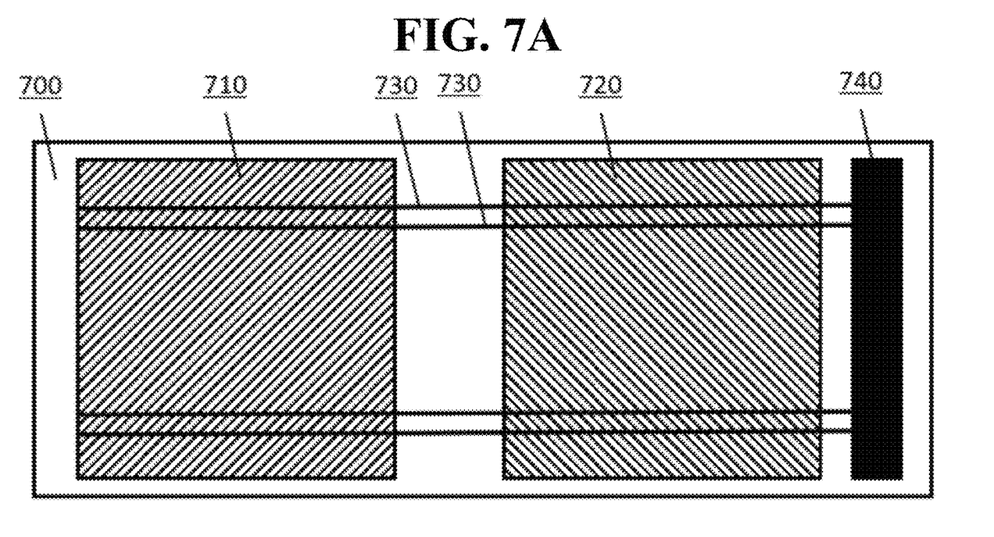
FIG. 7A shows a top schematic view of a single flexible substrate having two emissive stacks or layers disposed thereon according to an embodiment of the invention.
Figure 7B:
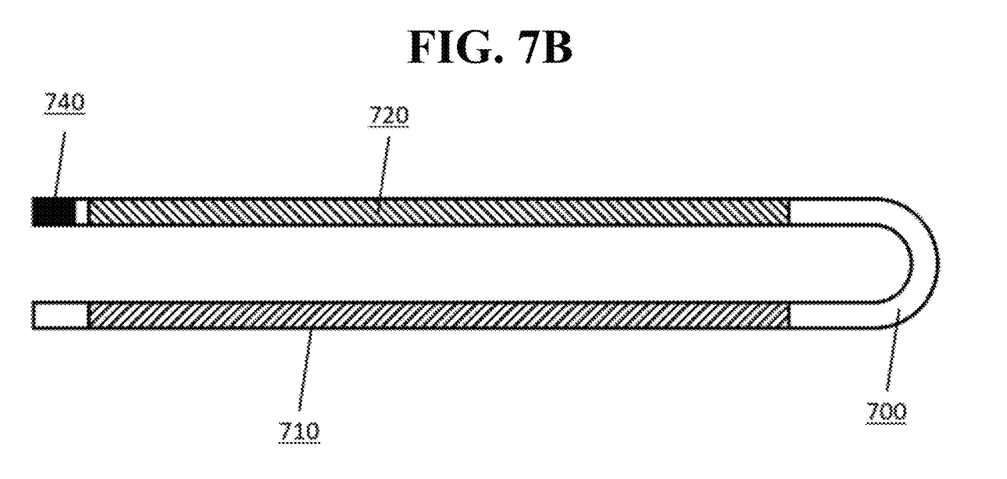
FIG. 7B shows a side view of the structure shown in FIG. 7A, with the substrate folded or bent to provide a structure as shown in FIG. 5, according to an embodiment of the invention.

In an embodiment, the two emissive stacks (e.g., emissive layers 550, 560 in FIG. 5 and associated layers) may be fabricated on a single flexible substrate, such as a plastic substrate. Both emissive layers, or both entire emissive panels (e.g., yellow and blue emissive stack panels as previously disclosed) may be fabricated at the same time on the same substrate, for example, by using a very low resolution mask while still avoiding the need for a fine metal mask or other high resolution pixel patterning. FIG. 7A shows a top schematic view of a single flexible substrate 700 on which two blanket emissive layers 710, 720 are disposed. The layers may be, for example, the blue and yellow emissive layers or stacks 550, 560 as shown in FIG. 5. Each emissive layer 710, 720 may be considered to be disposed over its own corresponding substrate, although a single substrate is used in the fabrication process. To achieve a structure as shown in FIG. 5, one substrate may be bent over the other to align the emissive layers as previously disclosed. Data lines 730 may be disposed across both emissive regions, and column drivers 740 may be disposed at one end of the common substrate or in any other desired location, including external to the common substrate. FIG. 7B shows a side view of the same structure, with the substrate folded or bent to provide a structure as shown in FIG. 5. As previously disclosed, each panel may be encapsulated, such as with a thin film encapsulation layer, prior to bending and assembly. Notably, driver costs may be reduced as only two column drivers and column lines are required per pixel, and the pitch of connections to the data lines is increased from 3 connections per pixel to 2 connections per pixel. A single scan driver may be used to drive both halves of the display sequentially as previously disclosed. Alternatively or in addition, only a single set of driver chips may be used, so the incremental cost and complexity of achieving double a display area will be less than that required for a single small high resolution display, as the cost of the backplane often is dominated by peripheral electronics, touch panels, and other components.

In an embodiment, both backplanes and substrates may be made transparent to achieve a fully transparent display, for example, one having an absorption of not more than about 30% in the 450-700 nm wavelength range. However, due the non-symmetric nature of the resultant display, it may be desirable to separately optimize the optical characteristics of each display side to prevent content appearing different in color, brightness, or the like when each side of the display is observed. For example, additional optical layers may be applied to one of the two display sides or, more preferably, underneath the TFT circuitry of one of the display sides. Alternatively or in addition, a second set of red and green color filters may be used so that both display surfaces include red and green color filters below the respective emissive layer planes. As another example, red and green color filters may be applied on both sides of the yellow emissive layer.

In an embodiment, a display architecture as disclosed herein may be used for a large area display. While costs for such displays typically are dominated by the backplane and OLED, studies indicate that the backplane may be about 10%-15% of the module cost. Accordingly, using an architecture as disclosed herein for a large area display may be economical and may provide additional benefits. For example, as TV resolutions are relatively low, either substrate can be transparent, thereby allowing the other emissive layer (i.e., the one disposed on the other substrate) to benefit from a cavity design with little concern of reducing pixel aperture ratios. As another example, although the use of a second backplane generally may increase costs, it also will greatly improve display performance, especially with respect to color gamut, brightness and lifetime, which may be more desirable than the relatively small increase in cost and complexity for a large area display.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A full-color display comprising:
   an electrode layer comprising a plurality of electrodes;
   a first continuous independently addressable organic emissive layer disposed over the plurality of electrodes and continuous over the plurality of electrodes;
   a second continuous independently addressable organic emissive layer disposed over the first continuous addressable organic emissive layer and continuous over the plurality of electrodes; and
   a conductive layer disposed between the first and second continuous independently addressable organic emissive layers, wherein the conductive layer provides electrical connections for a plurality of sub-pixels;
   wherein the display includes exactly two independently addressable organic emissive layers; and
   at least one of the plurality of electrodes comprises projections that extend between the at least one electrode and the conductive layer.

2. The full-color display of claim 1, wherein a first sub-pixel of the plurality of sub-pixels has a first optical path length, and a second sub-pixel of the plurality of sub-pixels has a second optical path length different than the first optical path length.

3. The full-color display of claim 1, wherein the conductive layer is transparent.

4. The full-color display of claim 1, wherein the display comprises continuous organic emissive layers of exactly two colors.

5. The full-color display of claim 1, further comprising a first color altering layer disposed in a stack with a first region of the first continuous independently addressable organic emissive layer and a second color altering layer disposed in a stack with a second region of the first continuous independently addressable organic emissive layer that is distinct from the first region of the first continuous independently addressable organic emissive layer.

6. The full-color display of claim 5, wherein the full-color display comprises a plurality of sub-pixels, and each sub-pixel in the display has a separate backplane circuit.

7. The full-color display of claim 5, wherein multiple sub-pixels are electrically connected to a common backplane circuit.

8. The full-color display of claim 7, wherein the display comprises less than one backplane circuit per sub-pixel.

9. The full-color display of claim 1, further comprising a first backplane and a second backplane, wherein the first continuous independently addressable organic emissive layer is in signal communication with the first backplane and the second continuous independently addressable organic emissive layer is in signal communication with the second backplane.

10. The full-color display of claim 1, wherein the first continuous independently addressable organic emissive layer comprises a yellow-emitting emissive material.

11. The full-color display of claim 10, further comprising a deep blue color altering layer disposed in a stack with the second continuous independently addressable organic emissive layer and not with the first continuous independently addressable organic emissive layer.

12. The full-color display of claim 1, wherein the second continuous independently addressable organic emissive layer comprises a blue-emitting emissive material.

13. The full-color display of claim 1, wherein the display comprises sub-pixels of at least four colors.

14. A device comprising the full-color display of claim 1, wherein the device comprises at least one selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a cell phone, a tablet, a phablet, a personal digital assistant (PDA), a laptop computer, a digital camera, a camcorder, a viewfinder, a micro-display, a 3-D display, a virtual reality or augmented reality display, a vehicle, a large area wall, a theater or stadium screen, and a sign.

15. A full-color display comprising:
a first electrode layer, comprising a plurality of first electrodes;
a first continuous independently addressable organic emissive layer disposed over the plurality of first electrodes and continuous over the plurality of first electrodes; and
a second continuous independently addressable organic emissive layer disposed over the first continuous addressable organic emissive layer and continuous over the plurality of first electrodes;
a conductive layer disposed over at least one of the plurality of first electrodes, the conductive layer comprising a plurality of vertical protrusions;
wherein the plurality of vertical protrusions extend above an upper boundary of the first continuous independently addressable organic emissive layer;
a second electrode layer disposed between the first and second continuous independently addressable organic emissive layers, wherein the plurality of vertical protrusions extend into the second electrode layer; and
a third electrode layer disposed over the second continuous independently addressable organic emissive layer;
wherein electrodes within each of the first, second, and third electrode layers are independently addressable; and
wherein the display includes exactly two independently addressable organic emissive layers.

16. A method of fabricating a full-color display, the method comprising:
disposing an electrode layer comprising a plurality of electrodes over a substrate;
fabricating a first continuous independently addressable organic emissive layer over the plurality of electrodes and continuous over the plurality of electrodes;
fabricating a conductive layer over the first continuous independently addressable organic emissive layer; and
fabricating a second continuous independently addressable organic emissive layer over the first continuous independently addressable organic emissive layer and continuous over the plurality of electrodes;
wherein the conductive layer is disposed between the first and second continuous independently addressable organic emissive layers and the conductive layer provides electrical connections for a plurality of sub-pixels;
wherein the display includes exactly two independently addressable organic emissive layers; and
wherein at least one of the plurality of electrodes comprises projections that extend between the at least one electrode and the conductive layer.

17. The method of claim 16, wherein the full-color display comprises continuous organic emissive layers of exactly two colors.

18. The method of claim 16, further comprising: fabricating a first color altering layer in a stack with a first region of the first continuous independently addressable organic emissive layer; and fabricating a second color altering layer in a stack with a second region of the first continuous independently addressable organic emissive layer that is distinct from the first region of the first continuous independently addressable organic emissive layer.

19. The method of claim 16, wherein the full-color display comprises less than one backplane circuit per sub-pixel.

20. The method of claim 16, wherein the first continuous independently addressable organic emissive layer comprises a yellow-emitting emissive material.

21. The method of claim 16, wherein the second continuous independently addressable organic emissive layer comprises a blue-emitting emissive material.

\* \* \* \* \*